United States Patent
Koo et al.

(10) Patent No.: US 9,142,438 B2
(45) Date of Patent: Sep. 22, 2015

(54) TECHNIQUES FOR CLAMPING AND DECLAMPING A SUBSTRATE

(71) Applicant: Varian Semiconductor Equipment Associates, Inc., Gloucester, MA (US)

(72) Inventors: Ilwoong Koo, North Andover, MA (US); Sung-Hwan Hyun, Hwasung-Shi (KR)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/872,417

(22) Filed: Apr. 29, 2013

(65) Prior Publication Data

US 2014/0240891 A1  Aug. 28, 2014

Related U.S. Application Data

(60) Provisional application No. 61/770,642, filed on Feb. 28, 2013.

(51) Int. Cl.
*H01L 21/683* (2006.01)

(52) U.S. Cl.
CPC ........ *H01L 21/6831* (2013.01); *H01L 21/6833* (2013.01)

(58) Field of Classification Search
CPC .................. H01L 21/6831; H01L 21/6833
USPC ............................................. 361/234
See application file for complete search history.

(56) References Cited

U.S. PATENT DOCUMENTS

| | | | |
|---|---|---|---|
| 5,491,603 A * | 2/1996 | Birang et al. | 361/234 |
| 2006/0043065 A1 | 3/2006 | Buchberger et al. | |
| 2009/0109595 A1 | 4/2009 | Herchen et al. | |
| 2010/0254063 A1 | 10/2010 | Sheng et al. | |
| 2011/0228439 A1 | 9/2011 | Kobayashi | |

FOREIGN PATENT DOCUMENTS

JP  2010-141352 A  6/2010

OTHER PUBLICATIONS

International Search Report and Written Opinion mailed Apr. 15, 2014 for PCT/US2014/017080 filed Feb. 19, 2014.

* cited by examiner

*Primary Examiner* — Scott Bauer

(57) ABSTRACT

Methods of clamping and declamping a wafer from a platen are disclosed. The platen comprises one or more electrodes, which are electrically biased to electrostatically clamp the wafer to the platen. The electrode is biased to a first voltage where the wafer may be processed. Thereafter, one or more voltages are subsequently applied to the electrodes. In some embodiments, each subsequent voltage is less than the previously applied voltage. In other embodiments, one or more of the subsequent voltages may be greater than the previously applied voltage. This sequence of voltage may reduce the likelihood that the wafer will stick or adhere to the platen during the removal process.

7 Claims, 3 Drawing Sheets

TECHNIQUES FOR CLAMPING AND DECLAMPING A SUBSTRATE

This application claims priority of U.S. Provisional Application Ser. No. 61/770,642, filed Feb. 28, 2013, the disclosure of which is herein incorporated by reference in its entirety.

FIELD

The present disclosure relates to an electrostatic clamp, more particularly to a method of clamping and declamping a target on an electrostatic clamp.

BACKGROUND

Ion implantation process is used in manufacturing electrical and optical devices. It is a process by which dopants or impurities are introduced into a target to alter the target's mechanical, electrical, and/or optical property. In integrated circuit (IC) device manufacturing, the target may be silicon or other semiconductor wafers, or one or more features or films thereon. Generally, the dopants or impurities may have one or more properties that differ from the properties of the target. Once implanted into a region in the target, the dopants or impurities may alter the region's properties.

During the ion implantation process, the target or the wafer 102 may be supported on a platen 112. As illustrated in FIG. 1, the platen 112 may comprise one or more electrodes 114 that are electrically connected to a power supply 116. In some embodiments, multiple concentric electrodes 114 are provided where one of the electrodes may be an inner electrode 114a and another electrode may be an outer electrode 114b. In other embodiments, multiple electrodes are provided at opposite sides of the platen 112. To electrostatically clamp the wafer 102 onto the platen, the bias voltage may be applied to the electrodes 114. In some embodiments, opposite voltage may be applied to different electrodes. For example, one of the electrodes 114 may be applied with positive voltage, whereas negative voltage is applied to another electrode 114. The magnitude of the clamping voltage may be the same or different.

Referring to FIG. 2, there is shown timing of the clamping voltage provided from the power supply 116 to one or more electrodes 114 in the platen 112. After the wafer 102 is loaded onto the platen 112, clamping voltage ($V_1$) is applied to the electrodes 114 at $T_1$ and the wafer 102 is electrostatically clamped onto the platen 112. Although not illustrated, those skilled in the art will recognize that if two or more electrodes are provided, one of the electrodes will be applied positive $V_1$ and the other electrode will be applied with negative $V_1$. The voltage applied to the electrodes 114 may be maintained during the ion implantation process, and the wafer 102 may remain clamped on the platen 112. After the ion implantation is completed (i.e. $T_2$), the clamping voltage $V_1$ is no longer applied to the electrodes 114, and the wafer 102 is removed from the platen 112. In some embodiments, the wafer 102 removal process may include lifting and separating the wafer 102 from the platen 112 with lift pins (not shown) and removing the wafer 102 from the platen 112. As known in the art, the voltage applied to the electrodes 114 is different from the voltage directly applied to the wafer 102 to process the wafer 102. For example, in some process, negative voltage is applied to the wafer 102 to attract positively charged ions. To clamp the wafer 102, voltage is applied to the electrodes 114 in the platen 112 to electrostatically clamp the wafer 102 onto the platen 112. As is also known in the art, a dielectric layer is disposed between the electrodes 114 and the wafer 102 to electrically isolate the wafer 102 from the electrodes 114.

The ion 10 directed and implanted into the wafer 102 may be positively charged ions 10. The residual charge in the wafer 102 due to implanting charged ions may cause at a portion of the wafer 102 to stick to the platen 112 surface. Unloading such a wafer 102 may be difficult. Also, if a layer of dielectric film is coated on the lower surface of the wafer 102, the neutralization of the charged ions and electrons may be delayed, thus causing the wafer 102 to remain attached to the platen 112 surface even when the clamping voltage has been removed. Attempting to separate the wafer 102 from the platen 112 surface using excessive force may result in wafer breakage. The wafer breakage may be more frequent if a layer of dielectric film (not shown) is coated on the lower surface of the wafer 102.

As such, a new method of clamping and declamping is needed.

SUMMARY

Methods of clamping and declamping a wafer from a platen are disclosed. The platen comprises one or more electrodes, which are electrically biased to electrostatically clamp the wafer to the platen. The electrode is biased to a first voltage where the wafer may be processed. Thereafter, one or more voltages are subsequently applied to the electrodes. In some embodiments, each subsequent voltage is less than the previously applied voltage. In other embodiments, one or more of the subsequent voltages may be greater than the previously applied voltage. This sequence of voltage may reduce the likelihood that the wafer will stick or adhere to the platen during the removal process.

In one embodiment, the method of clamping and declamping a wafer from a platen comprises placing the wafer on the platen, where the platen comprises an electrode for clamping the wafer onto the platen, while the electrode is biased at an initial voltage; applying a first voltage to the electrode of the platen to electrostatically clamp the wafer to the platen, the first voltage greater than the initial voltage; applying a second voltage to the electrode, the second voltage less than the first voltage and greater than the initial voltage; and removing the wafer from the platen after the application of the second voltage to the electrode.

In another embodiment, the method of clamping and declamping a wafer from a platen comprises placing the wafer on the platen where the platen comprising an electrode for clamping the wafer onto the platen, while the electrode is biased at an initial voltage; applying a first voltage to the electrode to electrostatically clamp the wafer to the platen, the first voltage greater than the initial voltage; applying a second voltage to the electrode, lower than the first voltage and greater than the initial voltage; applying a third voltage, higher than the second voltage and lower than the first voltage, to the electrode; and removing the wafer after application of the third voltage to the electrode.

In another embodiment, the method of clamping and declamping a wafer from a platen comprises placing the wafer on the platen, the platen comprising an electrode for clamping the wafer, while the electode is biased at 0 volts; applying a first voltage to the electrode to electrostatically clamp the wafer to the platen, the first voltage between 100V and 1000V; applying a second voltage to the electrode, the second voltage less than the first voltage and between 5V and 600V; applying a third voltage to the electrode after application of the second voltage, wherein the third voltage is less than the second voltage and between 5V and 600V; and removing the wafer from the platen after the application of the third voltage to the electrode.

BRIEF DESCRIPTION OF THE FIGURES

For a better understanding of the present disclosure, reference is made to the accompanying drawings, which are incorporated herein by reference and in which.

DETAILED DESCRIPTION

The present disclosure will now be described in more detail with reference to particular embodiments thereof as shown in the accompanying drawings. While the present disclosure is described below with reference to particular embodiments, it should be understood that the present disclosure is not limited thereto.

Figure 1:
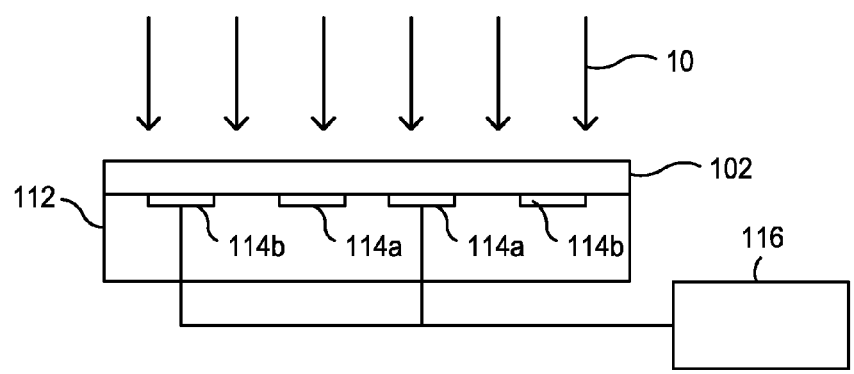
FIG. 1 shows an exemplary system for clamping and declamping a wafer to a platen according to the prior art.
Figure 2:
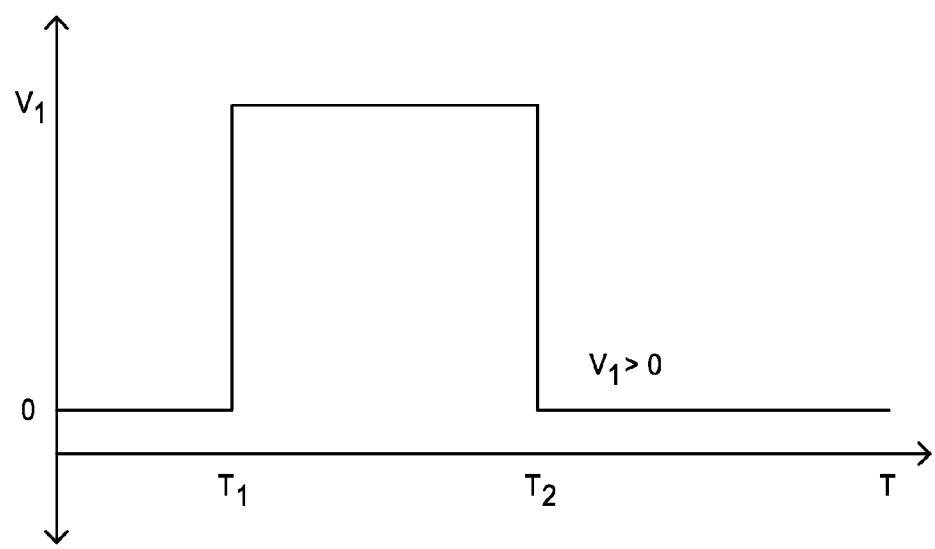
FIG. 2 shows a timing diagram that may be used with the system of FIG. 1 according to the prior art.
Figure 3:
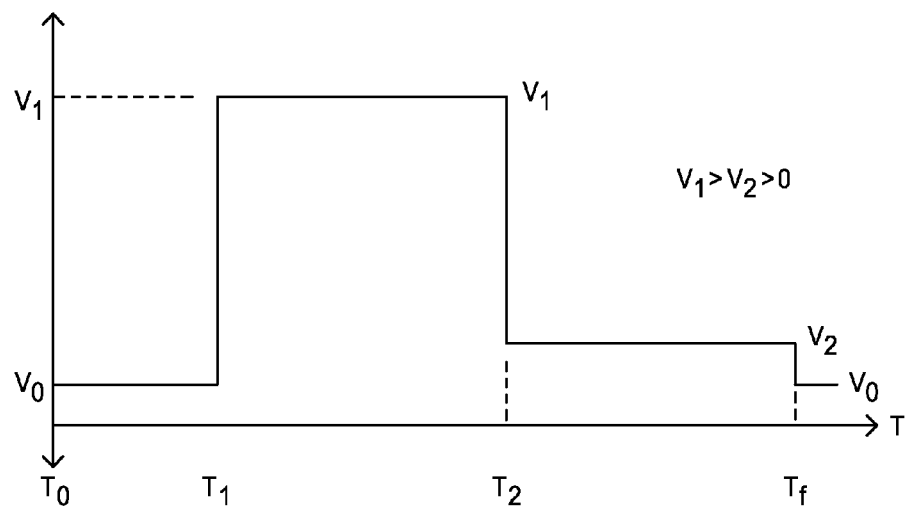
FIG. 3 shows a timing diagram that can be applied to the system of FIG. 1 according to one embodiment.

Referring to FIG. 3, there is shown an exemplary method of clamping and declamping a wafer according to one embodiment of the present disclosure. In this figure, the method is described with respect to the timing of the clamping voltage provided from the power supply 116 to one or more electrodes 114 in the platen 112. For clarity and simplicity, the method of the present embodiment will be described with respect to components shown in FIG. 1. As such, the method of the present embodiment should be understood in relation to FIG. 1.

In the present embodiment, the wafer 102 may be loaded onto the platen 112. Thereafter, at $T_1$, the electrodes 114 in the platen 112 may be applied with a first voltage $V_1$, and the wafer 102 may be electrostatically clamped onto the platen 112. Prior to applying the first voltage $V_1$, the electrodes 114 may be applied with $V_0$. In the present disclosure, the $V_0$ may be zero voltage or some other voltage less than $V_1$. In the present disclosure, the first voltage $V_1$ may be the clamping voltage, and the voltage may be in the range of about 100 V to about 1 kV. In one embodiment, the first voltage may be about 150 V. In another embodiment, the first voltage may be about 250 V. In another embodiment, the first voltage may be about 500 V. Yet in another embodiment, the first voltage may be about 750 V. If the platen comprises inner and outer electrodes 114a and 114b, one of the electrodes 114a and 114b may be applied with positive first voltage $V_1$ and the other one of the electrodes 114a and 114b may be applied with negative first voltage. The first voltage $V_1$ may be maintained until $T_2$ as illustrated in the figure, when a second voltage $V_2$ is applied to the electrodes 114. Between $T_1$ and $T_2$, the ion implantation process is performed.

As illustrated in FIG. 3, the second voltage $V_2$ applied to the electrode 114 may be less than the first voltage $V_1$. For example, the second voltage $V_2$ may range from about 5 V to about 100 V. In one embodiment, the second voltage $V_2$ may be about 5 V. In another embodiment, the second voltage $V_2$ may be about 15 V. In another embodiment, the second voltage $V_2$ may be about 25 V. Yet in another embodiment, the second voltage $V_2$ may be about 35 V.

After $T_2$, the process to dechuck/remove the wafer 102 from the platen 112 may be performed. For example, the wafer 102 may be dechucked from the platen 112 and the wafer 102 may be removed from the platen 112 at $T_2$ or after $T_2$. For example, the process to dechuck/remove the wafer 102 from the platen 114 may be performed at or after $T_2$, when the electrodes 114 are applied with the second voltage $V_2$ that is less than the first voltage $V_1$, but greater than $V_0$ applied to the electrodes prior to $T_1$. In one embodiment, the process may be performed at or after $T_f$ when $V_0$ is applied to the electrodes 114.

Figure 4:
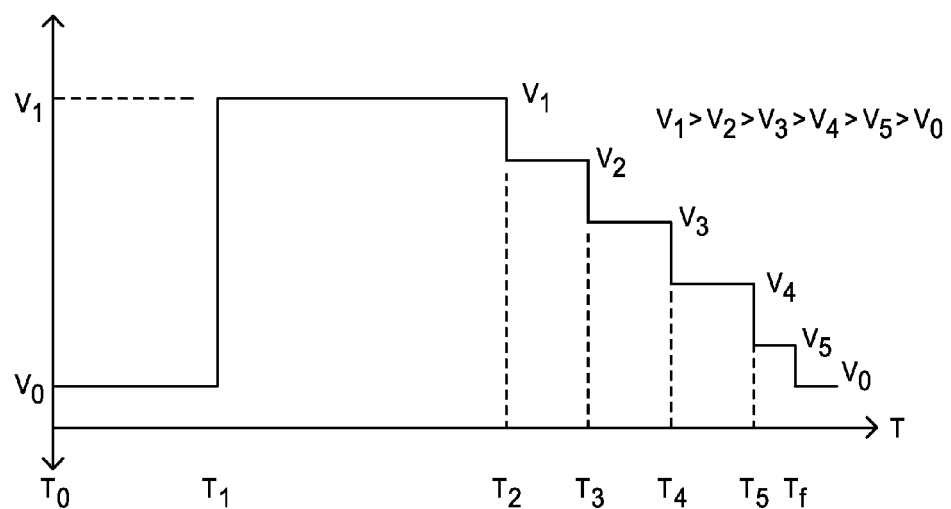
FIG. 4 shows a timing diagram that can be applied to the system of FIG. 1 according to a second embodiment.

Referring to FIG. 4, there is shown another exemplary method of clamping and declamping a wafer according to another embodiment of the present disclosure. In this figure, the method is described with respect to the timing of the clamping voltage provided from the power supply 116 to one or more electrodes 114 in the platen 112. For clarity and simplicity, the method of the present embodiment will be described with respect to components shown in FIG. 1. As such, the method of the present embodiment should be understood in relation to FIG. 1.

In the present embodiment, the wafer 102 may be loaded onto the platen 112. Thereafter, at $T_1$, the electrodes 114 in the platen 112 may be applied with a first voltage $V_1$, and the wafer 102 may be electrostatically clamped onto the platen 112. Prior to applying the first voltage $V_1$, the electrodes 114 may be applied with $V_0$. In the present disclosure, the $V_0$ may be zero voltage or some other voltage less than $V_1$. In the present disclosure, the first voltage $V_1$ may be the clamping voltage, and the voltage may be in the range of about 100 V to about 1 kV. In one embodiment, the first voltage may be about 150 V. In another embodiment, the first voltage may be about 250 V. In another embodiment, the first voltage may be about 500 V. Yet in another embodiment, the first voltage may be about 750 V. If the platen comprises inner and outer electrodes 114a and 114b, one of the electrodes 114a and 114b may be applied with positive first voltage $V_1$ and the other one of the electrodes 114a and 114b may be applied with negative first voltage. The first voltage $V_1$ may be maintained until $T_2$ as illustrated in the figure, when a second voltage $V_2$ is applied to the electrodes 114. Between $T_1$ and $T_2$, the ion implantation process is performed.

As illustrated in FIG. 4, the second voltage $V_2$ applied to the electrode may be less than the first voltage $V_1$, but greater than $V_0$. In the present embodiment, the second voltage $V_2$ may be any voltage ranging from about 75 V to about 800 V. In one example, the second voltage may be about 100 V. In another example, the second voltage may be about 150 V. In another example, the second voltage may be about 300 V. In another example, the second voltage may be about 400 V. In another example, the second voltage may be about 500 V. Yet in another example, the second voltage may be about 600 V.

The second voltage $V_2$ may be applied to the electrodes 114 until $T_3$ when the electrodes 114 in the platen 112 are applied with a third voltage $V_3$. In the present embodiment, the third voltage $V_3$ applied to the electrode may be less than the second voltage $V_2$, but greater than $V_0$. In the present embodiment, the third voltage $V_3$ may be any voltage ranging from about 50 V to about 600 V. In one example, the third voltage $V_3$ may be about 80 V. In another example, the third voltage $V_3$ may be about 150 V. In another example, the third voltage $V_3$ may be about 300 V. In another example, the third voltage $V_3$ may be about 450 V. In another example, the third voltage $V_3$ may be about 500 V. Yet in another example, the third voltage $V_3$ may be about 550 V.

The third voltage $V_3$ may be applied to the electrodes 114 until $T_4$ when the electrodes 114 in the platen 112 are applied with a fourth voltage $V_4$. In the present embodiment, the fourth voltage $V_4$ applied to the electrode may be less than the third voltage $V_3$, but greater than $V_0$. In the present embodiment, the fourth voltage $V_4$ may be any voltage ranging from about 25 V to about 500 V. In one example, the fourth voltage $V_4$ may be about 25 V. In another example, the fourth voltage $V_4$ may be about 75 V. In another example, the fourth voltage $V_4$ may be about 100 V. In another example, the fourth voltage $V_4$ may be about 200 V. In another example, the fourth voltage $V_4$ may be about 300 V. Yet in another example, the second voltage may be about 400 V. The fourth voltage $V_4$ may be applied to the electrodes 114 until $T_5$ when the electrodes 114 in the platen 112 are applied with a fifth voltage $V_5$. In the present embodiment, the fifth voltage $V_5$ applied to the electrode may be less than the fourth voltage $V_4$, but greater than $V_0$. In the present embodiment, the fifth voltage $V_5$ may be any voltage ranging from about 5 V to about 50 V. In one example, the fifth voltage $V_5$ may be about 10 V. In another example, the fifth voltage $V_5$ may be about 15 V. In another example, the fifth voltage $V_5$ may be about 30 V. In another example, the fifth voltage $V_5$ may be about 50 V. In another example, the fifth voltage $V_5$ may be about 75 V. Yet in another example, the fifth voltage $V_5$ may be about 100 V. The fifth voltage $V_5$ may be applied until $T_f$ when $V_0$ is applied to the electrodes 114.

After $T_2$, the process to dechuck/remove the wafer 102 from the platen 112 may be performed. For example, the wafer 102 may be dechucked from the platen 112 and the wafer 102 may be removed from the platen 112 at $T_2$ of after $T_2$. In particular, the process to dechuck/remove the wafer 102 from the platen 114 may be performed at $T_2$, $T_3$, $T_4$, $T_5$ or $T_f$.

Figure 5:
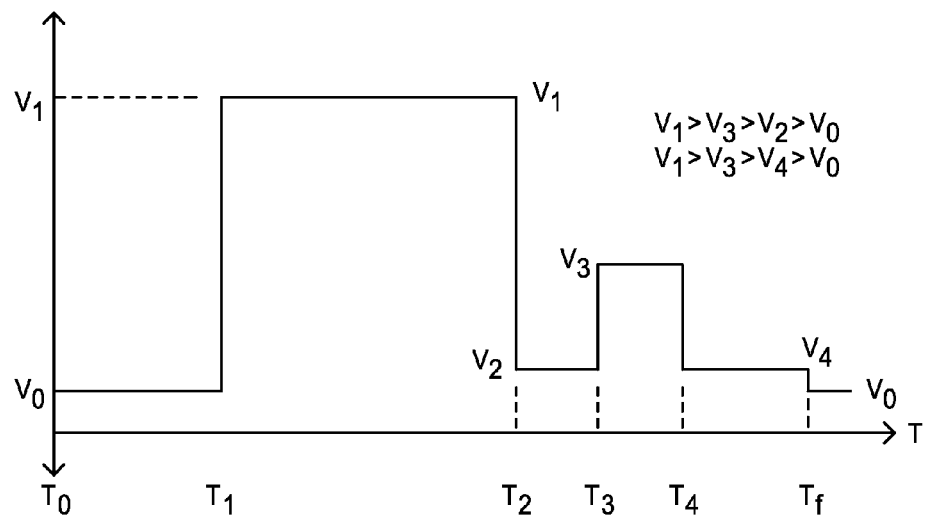
FIG. 5 shows a timing diagram that can be applied to the system of FIG. 1 according to a third embodiment.

Referring to FIG. 5, there is shown another exemplary method of clamping and declamping a wafer according to another embodiment of the present disclosure. In this figure, the method is described with respect to the timing of the clamping voltage provided from the power supply 116 to one or more electrodes 114 in the platen 112. For clarity and simplicity, the method of the present embodiment will be described with respect to components shown in FIG. 1. As such, the method of the present embodiment should be understood in relation to FIG. 1.

In the present embodiment, the wafer 102 may be loaded onto the platen 112. Thereafter, at $T_1$, the electrodes 114 in the platen 112 may be applied with a first voltage $V_1$, and the wafer 102 may be electrostatically clamped onto the platen 112. Prior to applying the first voltage $V_1$, the electrodes 114 may be applied with $V_0$. In the present disclosure, the $V_0$ may be zero voltage or some other voltage less than $V_1$. In the present disclosure, the first voltage $V_1$ may be the clamping voltage, and the voltage may be in the range of about 100 V to about 1 kV. In one embodiment, the first voltage may be about 150 V. In another embodiment, the first voltage may be about 250 V. In another embodiment, the first voltage may be about 500 V. Yet in another embodiment, the first voltage may be about 750 V. If the platen comprises inner and outer electrodes 114a and 114b, one of the electrodes 114a and 114b may be applied with positive first voltage $V_1$ and the other one of the electrodes 114a and 114b may be applied with negative first voltage. The first voltage $V_1$ may be maintained until $T_2$ as illustrated in the figure, when a second voltage $V_2$ is applied to the electrodes 114. Between $T_1$ and $T_2$, the ion implantation process is performed.

At $T_2$, the second voltage $V_2$ applied to the electrodes 114. The second voltage $V_2$ in the present embodiment may be less than the first voltage $V_1$, but greater than $V_0$. In the present embodiment, the second voltage $V_2$ may be any voltage ranging from about 5 V to about 600 V. In one example, the second voltage may be about 15 V. In another example, the second voltage may be about 50 V. In another example, the second voltage may be about 75 V. In another example, the second voltage may be about 100 V. In another example, the second voltage may be about 150 V. Yet in another example, the second voltage may be about 300 V.

The second voltage $V_2$ may be applied to the electrodes 114 until $T_3$ when the electrodes 114 in the platen 112 are applied with a third voltage $V_3$. In the present embodiment, the third voltage $V_3$ applied to the electrode may be greater than the second voltage $V_2$, but less than the first voltage $V_1$. In the present embodiment, the third voltage $V_3$ may be any voltage ranging from about 50 V to about 400 V. In one example, the third voltage $V_3$ may be about 75 V. In another example, the third voltage $V_3$ may be about 150 V. In another example, the third voltage $V_3$ may be about 250 V. In another example, the third voltage $V_3$ may be about 350 V. In another example, the third voltage $V_3$ may be about 400 V. Yet in another example, the third voltage $V_3$ may be about 450 V.

The third voltage $V_3$ may be applied to the electrodes 114 until $T_4$ when the electrodes 114 in the platen 112 are applied with a fourth voltage $V_4$. In the present embodiment, the fourth voltage $V_4$ applied to the electrode may be less than the third voltage $V_3$, but greater than $V_0$. In the present embodiment, the fourth voltage $V_4$ may be equal to the second voltage $V_2$. However, the present disclosure does not preclude the fourth voltage being greater or less than the second voltage $V_2$. In the present embodiment, the fourth voltage $V_4$ may be any voltage ranging from about 25 V to about 600 V. In one example, the fourth voltage $V_4$ may be about 15 V. In another example, the fourth voltage $V_4$ may be about 50 V. In another example, the fourth voltage $V_4$ may be about 75 V. In another example, the fourth voltage $V_4$ may be about 100 V. In another example, the fourth voltage $V_4$ may be about 150 V. Yet in another example, the fourth voltage $V_4$ may be about 300 V.

In the present embodiment, the fourth voltage $V_4$ may be applied to the electrodes 114 until $T_f$ when the electrodes 114 in the platen 112 are applied with $V_0$.

After $T_2$, the process to dechuck/remove the wafer 102 from the platen 112 may be performed. Although the wafer 102 dechucking/removing process may be performed any time after $T_2$, the process may preferably performed after $T_4$, or any time after the third voltage $V_3$ higher than the second voltage $V_2$ is applied.

Figure 6:
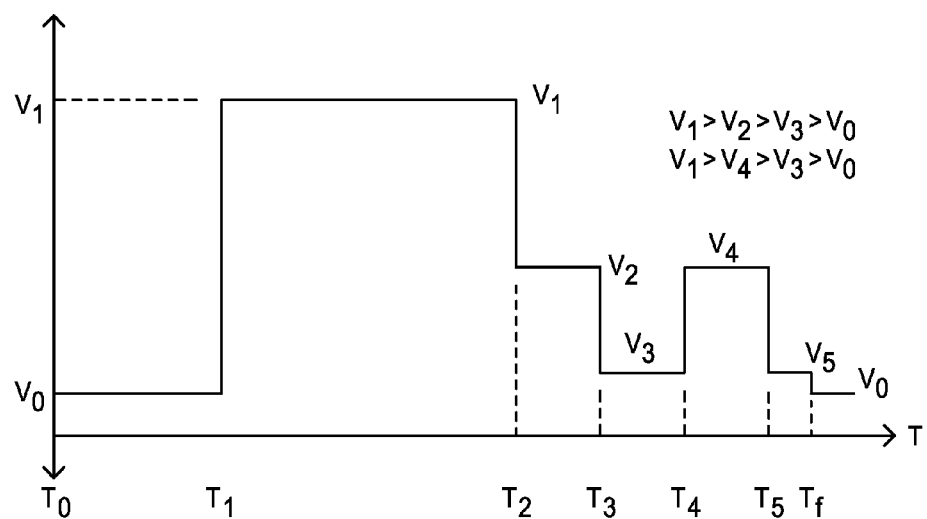
FIG. 6 shows a timing diagram that can be applied to the system of FIG. 1 according to a fourth embodiment.

Referring to FIG. 6, there is shown another exemplary method of clamping and declamping a wafer according to another embodiment of the present disclosure. In this figure, the method is described with respect to the timing of the clamping voltage provided from the power supply 116 to one or more electrodes 114 in the platen 112. For clarity and simplicity, the method of the present embodiment will be described with respect to components shown in FIG. 1. As such, the method of the present embodiment should be understood in relation to FIG. 1.

In the present embodiment, the wafer 102 may be loaded onto the platen 112. Thereafter, at $T_1$, the electrodes 114 in the platen 112 may be applied with a first voltage $V_1$, and the wafer 102 may be electrostatically clamped onto the platen 112. Prior to applying the first voltage $V_1$, the electrodes 114 may be applied with $V_0$. In the present disclosure, the $V_0$ may be zero voltage or some other voltage less than $V_1$. In the present disclosure, the first voltage $V_1$ may be the clamping voltage, and the voltage may be in the range of about 100 V to about 1 kV. In one embodiment, the first voltage may be about 150 V. In another embodiment, the first voltage may be about 250 V. In another embodiment, the first voltage may be about 500 V. Yet in another embodiment, the first voltage may be about 750 V. If the platen comprises inner and outer electrodes 114a and 114b, one of the electrodes 114a and 114b may be applied with positive first voltage $V_1$ and the other one of the electrodes 114a and 114b may be applied with negative first voltage. The first voltage $V_1$ may be maintained until $T_2$ as illustrated in the figure, when a second voltage $V_2$ is applied to the electrodes 114. Between $T_1$ and $T_2$, the ion implantation process is performed.

At $T_2$, the second voltage $V_2$ applied to the electrodes 114. The second voltage $V_2$ in the present embodiment may be less than the first voltage $V_1$, but greater than $V_0$. In the present embodiment, the second voltage $V_2$ may be any voltage ranging from about 5 V to about 600 V. In one example, the second voltage may be about 15 V. In another example, the second voltage may be about 50 V. In another example, the second voltage may be about 150 V. In another example, the second voltage may be about 250 V. In another example, the second voltage may be about 350 V. Yet in another example, the second voltage may be about 450 V.

The second voltage $V_2$ may be applied to the electrodes 114 until $T_3$ when the electrodes 114 in the platen 112 are applied with a third voltage $V_3$. In the present embodiment, the third voltage $V_3$ applied to the electrode may be less than the second voltage $V_2$, but greater than $V_0$. In the present embodiment, the third voltage $V_3$ may be any voltage ranging from about 5 V to about 600 V. In one example, the third voltage $V_3$ may be about 15 V. In another example, the third voltage $V_3$ may be about 50 V. In another example, the third voltage $V_3$ may be about 75 V. In another example, the third voltage $V_3$ may be about 100 V. In another example, the third voltage $V_3$ may be about 150 V. Yet in another example, the third voltage $V_3$ may be about 300 V.

The third voltage $V_3$ may be applied to the electrodes 114 until $T_4$ when the electrodes 114 in the platen 112 are applied with a fourth voltage $V_4$. In the present embodiment, the fourth voltage $V_4$ applied to the electrodes 114 may be greater than the third voltage $V_3$, but less than the first voltage $V_1$. In the present embodiment, the fourth voltage $V_4$ may be equal to the second voltage $V_2$. However, the present disclosure does not preclude the fourth voltage $V_4$ being greater or less than the second voltage $V_2$. In the present embodiment, the fourth voltage $V_4$ may be any voltage ranging from about 5 V to about 600 V. In one example, the fourth voltage $V_4$ may be about 15 V. In another example, the fourth voltage $V_4$ may be about 50 V. In another example, the fourth voltage $V_4$ may be about 150 V. In another example, the fourth voltage $V_4$ may be about 250 V. In another example, the fourth voltage $V_4$ may be about 350 V. Yet in another example, the fourth voltage $V_4$ may be about 450 V.

The fourth voltage $V_4$ may be applied to the electrodes 114 until $T_5$ when the electrodes 114 in the platen 112 are applied with a fifth voltage $V_5$. In the present embodiment, the fifth voltage $V_5$ applied to the electrodes 114 may be less than the fourth voltage $V_4$, but greater than $V_0$. In the present embodiment, the fifth voltage $V_5$ may be equal to the third voltage $V_3$. However, the present disclosure does not preclude the fifth voltage $V_5$ being greater or less than the third voltage $V_3$.

After $T_2$, the process to dechuck/remove the wafer 102 from the platen 112 may be performed. Although the wafer 102 dechucking/removing process may be performed any time after $T_2$, the process may preferably performed after $T_3$ or $T_5$, or any time after the fourth voltage $V_4$ higher than the third voltage $V_3$ is applied.

Herein, techniques for chucking and dechucking a wafer during wafer processing process are disclosed. The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of clamping and declamping a wafer from a platen, comprising:
   placing said wafer on said platen, said platen comprising an electrode for clamping said wafer onto said platen, while said electrode is biased at an initial voltage;
   applying a first voltage to said electrode of the platen to electrostatically clamp said wafer to said platen, said first voltage greater than said initial voltage;
   applying a second voltage to said electrode directly after application of said first voltage, said second voltage less than said first voltage and greater than said initial voltage;
   applying a third voltage to said electrode directly after application of said second voltage, wherein said third voltage is less than said second voltage and greater than said initial voltage;
   applying a fourth voltage to said electrode directly after application of said third voltage, wherein said fourth voltage is greater than said third voltage and less than said first voltage; and
   applying a fifth voltage to said electrode directly after application of said fourth voltage, wherein said fifth voltage is less than said fourth voltage and greater than said initial voltage, wherein said wafer is removed after application of said fifth voltage.

2. The method of claim 1, wherein said wafer is removed during application of a voltage greater than said initial voltage.

3. A method of clamping and declamping a wafer from a platen, comprising:
   placing said wafer on said platen, said platen comprising an electrode for clamping said wafer, while said electrode is biased at 0 volts;
   applying a first voltage to said electrode to electrostatically clamp said wafer to said platen, said first voltage between 100V and 1000V;
   applying a second voltage to said electrode directly after application of said first voltage, said second voltage less than said first voltage and between 5V and 600V;
   applying a third voltage to said electrode directly after application of said second voltage, wherein said third voltage is less than said second voltage and between 5V and 600 V; and
   applying a fourth voltage to said electrode directly after application of said third voltage, wherein said fourth voltage is greater than said third voltage, less than said first voltage and between 5V and 600V;

applying a fifth voltage to said electrode directly after application of said fourth voltage, wherein said fifth voltage is less than said fourth voltage and between 5V and 600V; and removing said wafer from said platen after said application of said fifth voltage to said electrode.

4. The method of claim 3, wherein said first voltage is 500V; said second voltage is 250V; and said third voltage is 15V.

5. The method of claim 3, wherein said first voltage is 500V; said second voltage is 350V; and said third voltage is 15V.

6. The method of claim 3, wherein said first voltage is 500V; said second voltage is 250V; said third voltage is 15V; said fourth voltage is 250V; and said fifth voltage is 15V.

7. The method of claim 3, wherein said first voltage is 500V; said second voltage is 350V; said third voltage is 15V; said fourth voltage is 350V; and said fifth voltage is 15 V.

* * * * *